United States Patent
Tam et al.

(10) Patent No.: US 7,547,956 B2
(45) Date of Patent: *Jun. 16, 2009

(54) THICK OXIDE P-GATE NMOS CAPACITOR FOR USE IN A LOW-PASS FILTER OF A CIRCUIT AND METHOD OF MAKING SAME

(75) Inventors: Derek Tam, Irvine, CA (US); Jasmine Cheng, Irvine, CA (US); Jungwoo Song, Irvine, CA (US); Takayuki Hayashi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/975,090

(22) Filed: Oct. 28, 2004

(65) Prior Publication Data

US 2005/0087839 A1 Apr. 28, 2005

Related U.S. Application Data

(63) Continuation of application No. 10/026,470, filed on Dec. 27, 2001, now Pat. No. 6,828,654.

(51) Int. Cl.
*H01L 23/58* (2006.01)
(52) U.S. Cl. .................. 257/532; 257/368; 438/307; 438/379; 327/157; 327/558
(58) Field of Classification Search ................ 257/532, 257/499, 528, 288, 368; 438/307, 379, 394; 327/157, 558
See application file for complete search history.

(56) References Cited

U.S. PATENT DOCUMENTS 4,042,945 A 8/1977 Lin et al.

(Continued)

FOREIGN PATENT DOCUMENTS

EP 0 902 483 A1 3/1999

(Continued)

OTHER PUBLICATIONS mos (Behavioral MOSFET Model), Mar. 1996.*

(Continued)

*Primary Examiner*—W. David Coleman
*Assistant Examiner*—Su C Kim
(74) *Attorney, Agent, or Firm*—Sterne, Kessler, Goldstein & Fox P.L.L.C.

(57) ABSTRACT

A circuit with dielectric thicknesses is presented that includes a low-pass filter including one or more semiconductor devices having a thick gate oxide layer, while further semiconductor devices of the circuit have thin gate oxide layers. The low-pass filter semiconductor device includes an N-type substrate, a P-type region formed on the N-type substrate, a thick gate oxide layer formed over the P-type region, a $P^+$ gate electrode formed over the thick gate oxide layer and coupled to a first voltage supply line, and $P^+$ pick-up terminals formed in the P-type region adjacent the gate electrode and coupled to a second voltage supply line. The low-pass filter semiconductor device acts as a capacitor, whereby a gate-to-substrate voltage is maintained at less than zero volts to maintain a stable control voltage for the circuit.

9 Claims, 4 Drawing Sheets

U.S. PATENT DOCUMENTS

| | | | |
|---|---|---|---|
| 4,249,194 A | 2/1981 | Rogers | |
| 4,335,359 A | 6/1982 | Kriedt et al. | |
| 4,377,029 A | 3/1983 | Ozawa | |
| 4,474,624 A | 10/1984 | Matthews | |
| 4,876,220 A | 10/1989 | Mohsen et al. | |
| 5,045,966 A | 9/1991 | Alter | |
| 5,130,564 A | 7/1992 | Sin | |
| 5,233,314 A | 8/1993 | McDermott et al. | |
| 5,608,258 A | 3/1997 | Rajkanan et al. | |
| 5,787,135 A | 7/1998 | Clark | |
| 5,793,074 A | 8/1998 | Choi et al. | |
| 5,914,513 A | 6/1999 | Shenai et al. | |
| 5,962,887 A | 10/1999 | Manning et al. | |
| 6,031,429 A | 2/2000 | Shen | |
| 6,055,193 A | 4/2000 | Manning et al. | |
| 6,100,770 A | 8/2000 | Litwin et al. | |
| 6,140,834 A * | 10/2000 | Takahashi | 326/21 |
| 6,303,957 B1 | 10/2001 | Ohwa | |
| 6,351,020 B1 | 2/2002 | Tarabbia et al. | |
| 6,433,398 B1 * | 8/2002 | Suzuki et al. | 257/392 |
| 6,472,233 B1 | 10/2002 | Ahmed et al. | |
| 6,590,247 B2 | 7/2003 | Ghilardelli et al. | |
| 6,621,128 B2 * | 9/2003 | Lee et al. | 257/369 |
| 6,828,654 B2 * | 12/2004 | Tam et al. | 257/532 |
| 2002/0042172 A1 * | 4/2002 | Kuroda et al. | 438/197 |
| 2002/0084492 A1 * | 7/2002 | Osanai et al. | 257/369 |
| 2003/0082895 A1 * | 5/2003 | Ko et al. | 438/585 |

FOREIGN PATENT DOCUMENTS

| | | |
|---|---|---|
| EP | 0 910 170 A2 | 4/1999 |
| JP | 06-132728 | 5/1994 |
| JP | 06132728 | 5/1994 |
| WO | WO 97/18588 | 5/1997 |
| WO | WO 01/46989 A2 | 6/2001 |

OTHER PUBLICATIONS

Partial International Search Report cited in European Application No. EP 02 25 8965 dated Aug. 4, 2008.

Lim et al., "A Low-Noise Phase-Locked Loop Design by Loop Bandwith Optimization,"*IEEE J. Solid-State Circuits* 35(6):807-815 (2000).

International Search Report cited in European Application No. EP 02 25 8965 dated Oct. 24, 2008.

* cited by examiner

THICK OXIDE P-GATE NMOS CAPACITOR FOR USE IN A LOW-PASS FILTER OF A CIRCUIT AND METHOD OF MAKING SAME

CROSS-REFERENCE TO RELATED APPLICATIONS

This application is a continuation of U.S. patent application Ser. No. 10/026,470, filed Dec. 27, 2001, which is hereby incorporated by reference in its entirety.

BACKGROUND OF THE INVENTION

1. Field of the Invention

The present invention relates to semiconductor devices and, in particular, to a thick oxide P-gate NMOS capacitor for use in a circuit, such as a phase-locked loop circuit, and methods for making the same.

2. Background Art

A phase-locked loop (PLL) synthesizer circuit is a negative feedback circuit that operates so as to bring a set frequency into conformity with an output signal frequency. PLL synthesizer circuits are used for automobile telephones, portable telephones, radios, televisions, cable modem tuners, and the like. As circuit integration and the desire for faster circuits increase, circuit designers are faced with new challenges to implement known functionality, such as in ability to maintain lock in a PLL synthesizer circuit.

An example of a conventional PLL synthesizer circuit will be explained with reference to FIGS. 1-3 of the accompanying drawings. A quartz oscillator 102 outputs a reference clock signal "CK" of a natural frequency based on the oscillation of a quartz oscillation element to a reference frequency divider 104. The reference frequency divider 104 divides the frequency of the reference clock signal CK on the basis of a set frequency, which is externally set, predetermined, or is otherwise programmed, and outputs a reference signal "fr" to a phase comparator 106. A comparison frequency divider 108 outputs a comparison signal "fp" to the phase comparator 106. The phase comparator 106 compares the reference signal fr with the comparison signal fp, and outputs pulse signals "φR" and "φP", which correspond to the frequency difference and phase difference, respectively, to a charge pump 110.

The charge pump 110 outputs a signal "SCP" (charge pump signal) on the basis of the pulse signals φR, φP output from the phase comparator 106, to a low-pass filter (hereinafter referred to as "LPF") 112. This output signal SCP contains a pulse component in its D.C. component. The D.C. component rises and falls with the frequency changes of the pulse signals φR, φP, while the pulse component changes on the basis of the phase difference of the pulse signals φR, φP.

The LPF 112 smooths the output signal SCP of the charge pump 110, and outputs a signal "SLPF" (LPF signal), from which a radio frequency (RF) component is removed, to a voltage controlled oscillator (hereinafter referred to as "VCO") 114. The VCO 114 outputs a signal "SVCO" (VCO signal) having a frequency corresponding to the voltage value of the output signal SLPF of the LPF 112 to an outside circuit (not shown) and to the comparison frequency divider 108 described above. The comparison frequency divider 108 divides the frequency of the output signal SVCO of the VCO 114 by a necessary factor and outputs it to the phase comparator 106.

As shown in FIG. 2, an unlock condition results when a setting of the comparison signal fp, for example, is changed such that the frequency and/or phase of the reference signal fr are not in conformity with those of the comparison signal fp. When these differences in the frequencies and phases of the reference signal fr and the comparison signal fp occur, the phase comparator 106 outputs the pulse signals φR and φP. The D.C. component of the output signal SCP of the charge pump 110 is passed by LPF 112. The voltage level of the output signal SLPF of the LPF 112 rises on the basis of the output signal SCP, and the output signal SLPF of the LPF 112 converges to a voltage level corresponding to the comparison signal fp set afresh, and the operation mode returns to the lock state.

When the frequency of the comparison signal fp of the PLL synthesizer circuit is lowered as described above, the output signal SLPF of the LPF 112 rises from V1 to V2 as indicated by a solid line in FIG. 3, for example. However, since the phase difference occurs even when the frequency of the reference signal fr is in conformity with that of the comparison signal fp, the output signal SLPF, which has risen to a point near V2, converges with V2 while repeating an over-shoot and under-shoot.

Prior art integrated versions of the PLL of FIG. 1 typically implement the LPF 112 using a simple RC circuit. The capacitor of the RC circuit has comprised a PMOS FET (P-type metal oxide semiconductor field effect transistor). FIG. 4 is a schematic diagram of a PMOS FET configured as a capacitor. The capacitance is formed by the gate capacitance and the depletion capacitance in series. If the transistor is in the strong inversion mode ($V_{GS} > V_{TH}$), the gate capacitance is the sole contributor of the total capacitance.

The gate capacitance is inversely proportional to the thickness of the gate oxide. As the technology advances, the thickness of the gate oxide of the transistor decreases, thus increasing the capacitance. However, a decrease of the gate oxide thickness causes the leakage current through the gate to increase. In the LPF 112 of the PLL circuit in FIG. 1, the gate voltage across the capacitor is used to control the VCO 114, which outputs the desired frequency SVCO. If there is gate leakage in the PMOS FET capacitor the control voltage will not be held constant and will cause drift in the output frequency of VCO 114.

What is needed is a technique to obtain a stable PLL control voltage, without drastically increasing the complexity and cost of the circuit.

BRIEF SUMMARY OF THE INVENTION

The present invention is directed to a circuit with dielectric thicknesses that includes a low-pass filter including one or more semiconductor devices having a thick gate oxide layer, while further semiconductor devices of the circuit have thin gate oxide layers. The semiconductor device of the low-pass filter includes an N-type substrate, a P-type region formed on the N-type substrate, a thick gate oxide layer formed over the P-type region, a P+ gate electrode formed over the thick gate oxide layer and coupled to a first voltage supply line, and P+ pick-up terminals formed in the P-type region adjacent the gate electrode and coupled to a second voltage supply line. The low-pass filter semiconductor device acts as a capacitor, whereby a gate-to-substrate voltage is maintained to maintain a stable control voltage for the circuit. The P+ gate electrode can be made from polysilicon. The N-type substrate can include a deep NWELL. The oxide layer thickness is application and technology-specific. Methods for making the semiconductor device and circuit are also presented.

These and other advantages and features will become readily apparent in view of the following detailed description of the invention.

BRIEF DESCRIPTION OF THE FIGURES

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

DETAILED DESCRIPTION OF THE INVENTION

Figure 1:
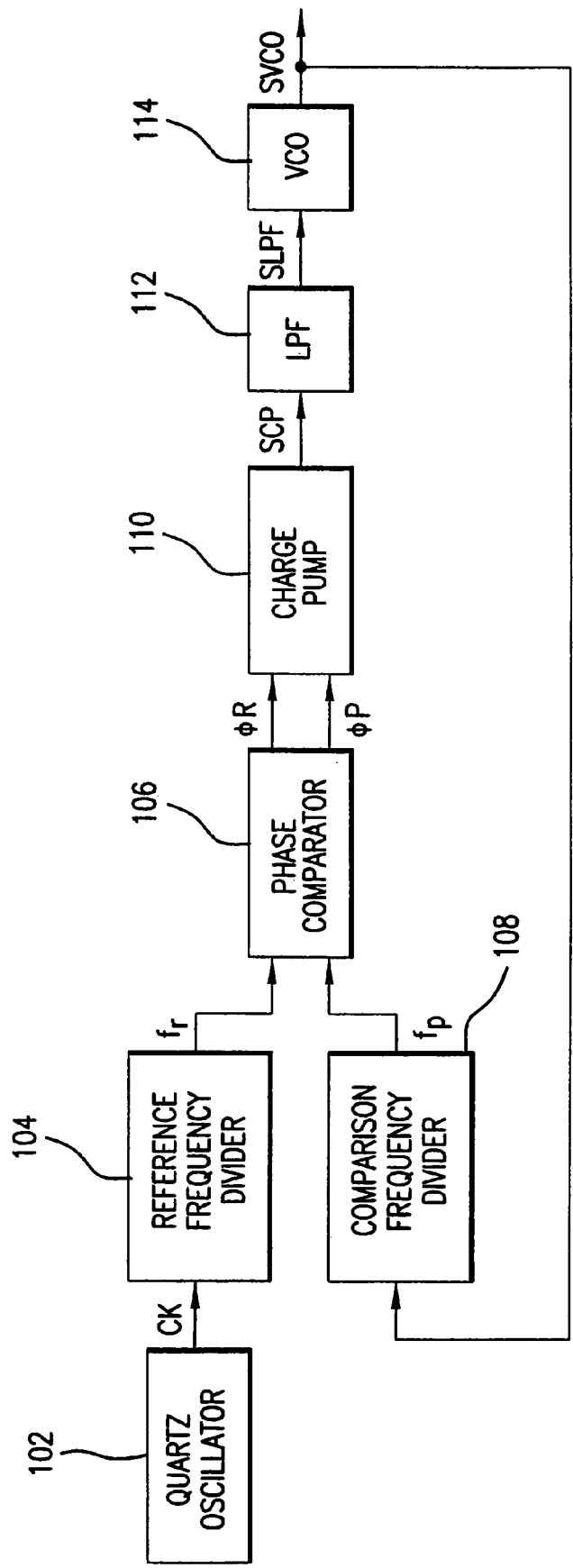
FIG. 1 illustrates a conventional PLL circuit.
Figure 2:
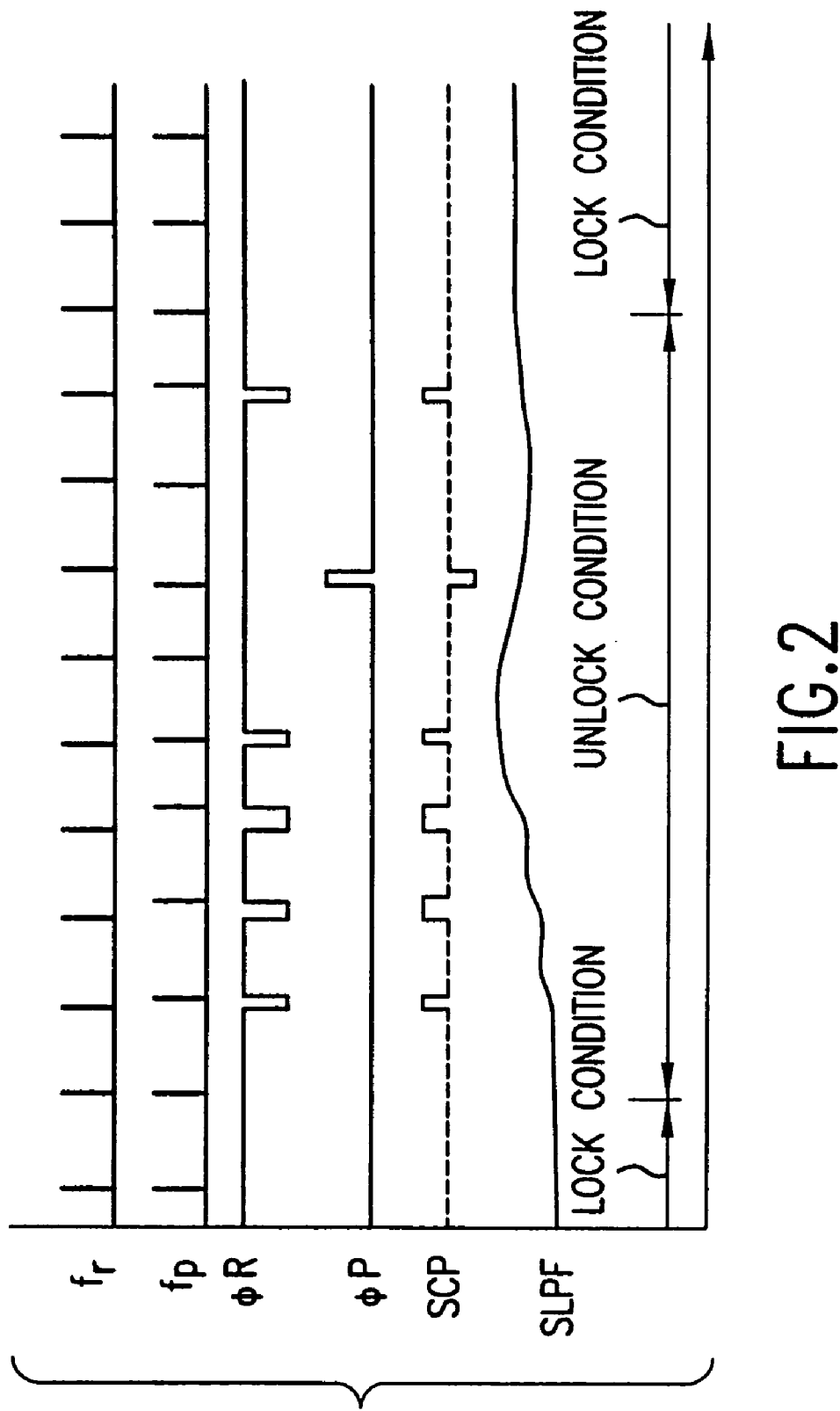
FIGS. 2 and 3 are plots of signals corresponding to the circuit of FIG. 1.
Figure 3:
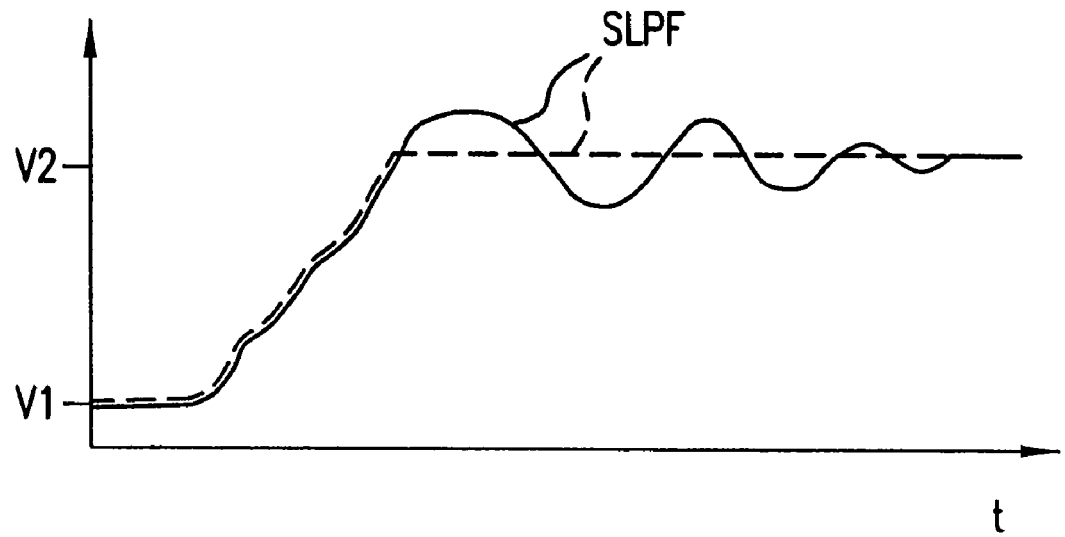
Figure 4:
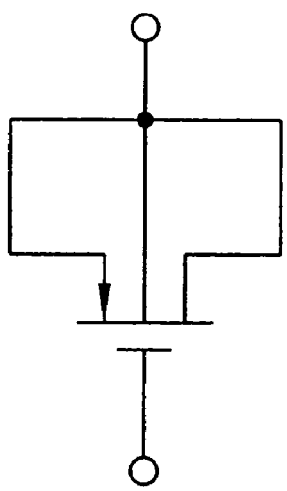
FIG. 4 is a schematic diagram of a PMOS FET configured as a capacitor.

The preferred embodiment of the present invention will now be discussed in detail. While specific features, configurations and arrangements are discussed, it should be understood that this is done for illustration purposes only. A person skilled in the relevant art will recognize that other steps, configurations and arrangements or devices may be used to achieve the features of the invention without departing from the spirit and scope thereof. Indeed, for the sake of brevity, conventional electronics, manufacturing of semiconductor devices, and other functional aspects of the method/apparatus (and components of the individual operating components of the apparatus) may not be described in detail herein.

The terms, chip, integrated circuit, monolithic device, semiconductor device, and microelectronic device, are often used interchangeably in this field. The present invention is applicable to all the above as they are generally understood in the field.

Historically, the material most commonly used in the semiconductor industry to form the gate insulator layer of a field effect transistor (FET) is silicon dioxide. Thus the gate insulator layer is frequently referred to simply as the gate oxide. The expression gate dielectric is also used to describe the gate insulator layer.

The term "gate" is context sensitive and can be used in two ways when describing integrated circuits. Gate refers to a circuit for realizing an arbitrary logical function when used in the context of a logic gate. However, as used herein, gate refers to the insulated gate terminal of a three terminal FET when used in the context of transistor circuit configurations or formation of transistor structures. The expression "gate terminal" is generally interchangeable with the expression "gate electrode". A FET can be viewed as a four terminal device when the semiconductor body is considered, for the purpose of describing illustrative embodiments of the present invention, the FET will be described using the traditional gate-drain-source, three terminal model.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly. Polysilicon is commonly used as the gate terminal of FET devices.

Source/drain terminals refer to the terminals of a FET, between which conduction occurs under the influence of an electric field, subsequent to the inversion of the semiconductor surface under the influence of a vertical electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit. However, as described below, since the semiconductor device described herein does not function as a transistor in the conventional sense, the geometrically symmetrical regions that provide a supply voltage are called "pick-ups" rather than source and drain.

In conventional integrated circuit processing, FETs are fabricated with a single gate dielectric thickness. Although there may be some slight variation in gate dielectric thickness across a wafer, typically the result of manufacturing anomalies, these differences in dielectric thickness are usually too small to make any substantial difference in the electrical characteristics of the FETs of an integrated circuit, particularly with respect to the ability of those FETs to withstand a higher operating voltage. More recently, processing techniques permit FETs more than one gate dielectric thickness. Thus, on the same chip, designers can select to fabricate some FETs with a first gate dielectric thickness and other FETs with a second gate dielectric thickness.

As discussed below, the following more fully describes the present invention.

In 0.13 µm (micron) technology, the inventors have observed that although increasing the thickness of the gate oxide of the PMOS FET capacitor in the LPF of the PLL circuit solves the basic leakage problem, another problem can arise. In addition to the reduction in gate oxide thickness, technology advances cause reduction in the supply voltage necessary to operate the smaller devices. Thus, the threshold voltage of the transistor having a thicker gate oxide is approximately equal to 0.6V (volts), as compared to 0.3V in the thin oxide 0.13 µm-technology transistors. In the PLL application described above, the control voltage can vary from 0.2V above ground to 0.3V below the supply voltage ($V_{DD}$). (Those skilled in the art would appreciate that the selection of the voltage level for the voltage supply typically depends on the type of fabrication technology used to manufacture the circuitry.) As a result, a transistor with a thick gate oxide may not be able to turn on depending on the control voltage level. The above voltage values are process-dependent and provided by way of examples only, and not limitation.

Figure 5A:
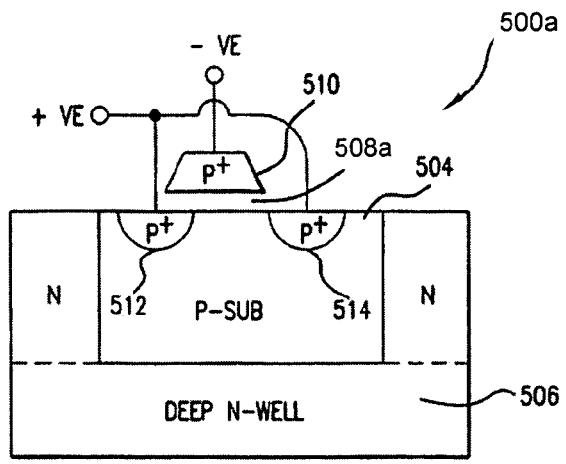
FIG. 5a illustrates the structure of a P-gate NMOS semiconductor with thick oxide layer (device 500a), according to an embodiment of the present invention.
Figure 5B:
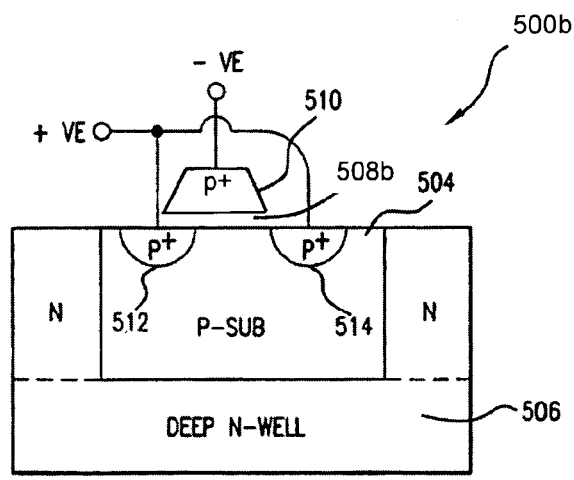
FIG. 5b illustrates the structure of a P-gate NMOS semiconductor with thin oxide layer (device 500b), according to an embodiment of the present invention.

To solve this problem the inventors developed a P-type doped gate ("P-gate") NMOS device. An exemplary structure of a P-gate NMOS semiconductor device 500a with a thick oxide layer according to the present invention is illustrated in FIG. 5a. An exemplary structure of a P-gate NMOS semiconductor device 500b with a thin oxide layer 508b according to the present invention is illustrated in FIG. 5b. Referring to FIG 5a, semiconductor device 500a comprises a P-type region or substrate 504 formed in a N-type substrate 506. (As would become apparent to a person skilled in the relevant art, the conventions "P-type" and "N-type" represent nominal doping levels, as compared to higher doped regions commonly designated P+ or N+, or lightly doped regions commonly designated P− or N−.) Substrate 506 can comprise a deep N-type well ("NWELL"). In an alternative embodiment, the deep NWELL can be formed in or on another substrate.

A thick oxide 508a is formed on the region/substrate 504. The thick oxide 508a can comprise silicon dioxide, silicon nitride, or the like, as would be apparent to a person skilled in the semiconductor art. The thick oxide can be formed to a thickness of between about 20 and 100 Å (Angstroms). The thick oxide material and specific thickness are application (e.g., depending on the applied voltage) and/or process (e.g., 0.13 μm-technology) specific, as would become apparent to a person skilled in the relevant art.

A polysilicon gate electrode 510 is doped with a P+ dopant. Other gate structures will become apparent to persons skilled in the relevant art. P+ doped pick-up terminals 512 and 514 are formed in the P-substrate 504.

To form a capacitor, region 504 of the device 500a is coupled to a first (e.g., positive +$V_{DD}$) voltage supply line +ve via the pick-up terminals 512 and 514, and the gate 510 is coupled to a second (e.g., negative or ground) voltage supply line −ve.

Figure 6:
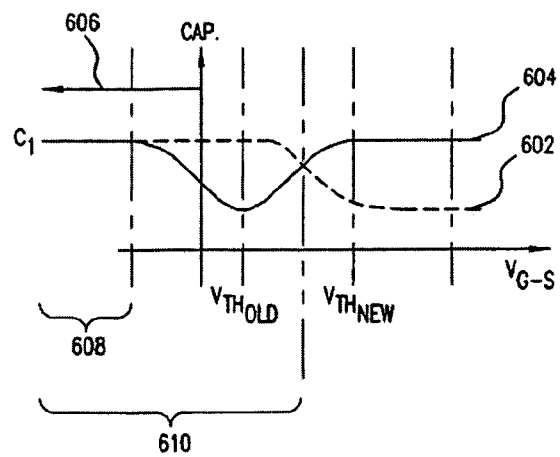
FIG. 6 is a plot of capacitance versus voltage (C-V) for a P-gate NMOS capacitor, according to an embodiment of the present invention.

In this configuration, the device of FIG. 5a operates like an NMOS transistor in an accumulation mode with a shifted threshold voltage ($V_{TH}$). This $V_{TH\text{-}NEW}$ shift is shown at curve 602 in capacitance versus voltage (C-V) plot of FIG. 6. The magnitude of the shift is about 1V, compared to the nominal $V_{TH\text{-}OLD}$ of an NMOS transistor, represented by curve 604. According to the present invention, the device 500a can maintain operation in the accumulation mode when its gate-to-substrate voltage is less than zero volts. Region 606 represents the operational mode of device 500. As curve 602 implies, at region 606 device 500a maintains an operational capacitance C1. Area 608 represents the accumulation region of an NMOS transistor. Area 610 corresponds to an enlarged accumulation region of device 500a.

The low pass filter 112 of FIG. 1 is used to filter out high frequency components of the SCP signal. According to an embodiment of the present invention, filter 112 can comprise a P-gate NMOS semiconductor device 500, as described above in connection with FIG. 5a. The charge pump 110 preferably accumulates electrical charge based on the difference signals and provides a voltage control signal with sufficient current to the VCO 114 to adjust phase and/or frequency of the VCO output.

The PLL shown in FIG. 1 is for illustrative purposes only. The present invention can be applied to a PLL circuit, as well as any other circuit including a LPF.

While various embodiments of the present invention have been described above, it should be understood that they have been presented by way of example, and not limitation. It will be apparent to persons skilled in the relevant art that various changes in form and detail can be made therein without departing from the spirit and scope of the invention as defined in the claim(s). Among other reasons, this is true in light of (later) developing technology and terms within the relevant art(s). Thus the present invention should not be limited by any of the above-described exemplary embodiments, but should be defined only in accordance with the following claims and their equivalents.

For example, the present invention has been described with reference to a P-gate NMOS device formed in an NWELL. However, those skilled in the art would appreciate that P-type and N-type dopant types could be reversed to form an inverse device that would function very similar to the present invention given proper biasing modification that would also become apparent based on the above description.

What is claimed is:

1. A circuit with dual gate dielectric thicknesses, the circuit comprising:
    a low-pass filter including a capacitor having a thick gate oxide layer; and
    further devices having thin gate oxide layers; and
    wherein the capacitor comprises:
        an N-type substrate;
        a P-type region within the N-type substrate having the thick gate oxide layer formed over the P-type region;
        a P+ gate electrode formed over the thick gate oxide layer and coupled to a first voltage supply line; and
        P+ pick-up terminals within the P-type region adjacent the gate electrode and coupled to a second voltage supply line,
    wherein the thick gate oxide layer of the capacitor reduces leakage current such that a gate-to-substrate voltage of the capacitor is maintained at less than zero volts, wherein a constant capacitance is maintained thereby maintaining a stable control voltage for the circuit.

2. The circuit of claim 1, wherein the P+ gate electrode comprises polysilicon.

3. The circuit of claim 1, wherein the N-type substrate comprises a deep NWELL.

4. The circuit of claim 1, wherein the thick gate oxide layer is between about 20 and 100 Å thick.

5. In a low-pass filter of a circuit with dual gate dielectric thicknesses, a semiconductor device having a thick gate oxide layer, the semiconductor device comprising:
    an N-type substrate;
    a P-type region within the N-type substrate having the thick gate oxide layer formed over the P-type region;
    a P+ gate electrode formed over the thick gate oxide layer and coupled to a first voltage supply line; and
    P+ pick-up terminals within the P-type region adjacent the gate electrode and coupled to a second voltage supply line,
    wherein the thick gate oxide layer of the low-pass filter semiconductor device reduces leakage current such that a gate-to-substrate voltage of the low-pass filter semiconductor device is maintained at less than zero volts with a constant capacitance, thereby maintaining a stable control voltage for the circuit;
    wherein the circuit includes further semiconductor devices having thin gate oxide layers.

6. The low-pass filter semiconductor device of claim 5, whereby the low-pass filter semiconductor device functions as a capacitor during operation.

7. The low-pass filter semiconductor device of claim 5, wherein the P+ gate electrode comprises polysilicon.

8. The low-pass filter semiconductor device of claim 5, wherein the N-type substrate comprises a deep NWELL.

9. The low-pass filter semiconductor device of claim 5, wherein the thick gate oxide layer is between about 20 and 100 Å thick.

* * * * *